(12) United States Patent
Schreiber et al.

(10) Patent No.: US 8,303,792 B1
(45) Date of Patent: Nov. 6, 2012

(54) HIGH STRENGTH ELECTRODEPOSITED SUSPENSION CONDUCTORS

(75) Inventors: Christopher Schreiber, Lake Elsinore, CA (US); Peter Hahn, Wildomar, CA (US); Christopher Dunn, Austin, TX (US)

(73) Assignee: Magnecomp Corporation, Murrieta, CA (US)

( * ) Notice: Subject to any disclaimer, the term of this patent is extended or adjusted under 35 U.S.C. 154(b) by 759 days.

(21) Appl. No.: 12/200,947

(22) Filed: Aug. 29, 2008

Related U.S. Application Data

(60) Provisional application No. 60/968,686, filed on Aug. 29, 2007.

(51) Int. Cl.
C25D 5/02 (2006.01)

(52) U.S. Cl. .................................. 205/122; 205/241

(58) Field of Classification Search ............. 205/102, 205/105, 122, 125, 241
See application file for complete search history.

(56) References Cited

U.S. PATENT DOCUMENTS

| | | | |
|---|---|---|---|
| 4,461,680 A * | 7/1984 | Lashmore | ............ 205/104 |
| 4,863,808 A | 9/1989 | Sallo | |
| 5,431,803 A | 7/1995 | DiFranco et al. | |
| 5,454,926 A | 10/1995 | Clouser et al. | |
| 5,666,717 A | 9/1997 | Matsumoto et al. | |
| 5,681,443 A | 10/1997 | Ameen et al. | |
| 5,685,970 A | 11/1997 | Ameen et al. | |
| 5,958,209 A | 9/1999 | Sakai et al. | |
| 6,086,743 A | 7/2000 | Ameen et al. | |
| 6,093,499 A * | 7/2000 | Tomioka | ............ 428/606 |
| 6,146,480 A | 11/2000 | Centanni et al. | |
| 6,194,056 B1 | 2/2001 | Sakai et al. | |
| 6,489,034 B1 | 12/2002 | Wang et al. | |
| 6,589,381 B2 | 7/2003 | Poutasse et al. | |
| 6,602,362 B2 * | 8/2003 | Tomioka et al. | ............ 148/435 |
| 6,835,294 B2 * | 12/2004 | Tsuchida et al. | ............ 205/98 |
| 2003/0221967 A1 * | 12/2003 | Tsuchida et al. | ............ 205/103 |
| 2005/0167281 A1 * | 8/2005 | Ohsawa et al. | ............ 205/223 |

FOREIGN PATENT DOCUMENTS

JP  2007317900 A  12/2007

OTHER PUBLICATIONS

"Metal Finishing Guidebook Directory 1987," Jan. 1987, p. 212-214. 13th ed. (Metals and Plastics Publications, Inc.; Hackensack, NJ).
Anonymous, Copper Foil, Gould Electronics, Hyper Performance Advanced Bond brochure.
Rocky Hilburn et al., TheState of Copper, Printed Circuit Design & Manufacture, May 2005 pp. 24-29.
J. Jang and T. Earmme, Interfacial Study of Polyimide/Copper System Using Silane-Modified Polyvinylimidazoles as Adhesion Promoters, Polymer 42 (2001) pp. 2871-2876.

* cited by examiner

*Primary Examiner* — Luan Van
(74) *Attorney, Agent, or Firm* — Intellectual Property Law Offices of Joel Voelzke, APC

(57) ABSTRACT

A method of preparing an additive suspension circuit for a hard disk drive suspension includes electrodepositing an alloy of copper using an electrolytic bath containing copper sulfate, tin, iron, sulfuric acid, and hydrochloric acid, using pulsed current of about 10-45 amperes per square foot.

16 Claims, 5 Drawing Sheets

FIG. 1A  SS Clean 
FIG. 1B  Coat & Cure PI 
FIG. 1C  Apply, expose & and develop resist defining circuit image 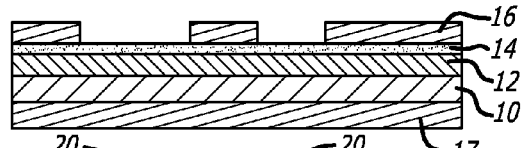
FIG. 1D  Cu Plating 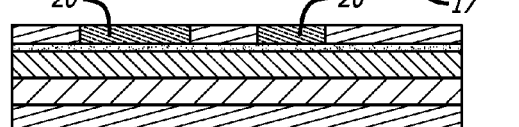
FIG. 1E  Resist Strip 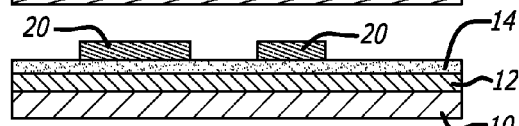
FIG. 1F  Cover PI Coating 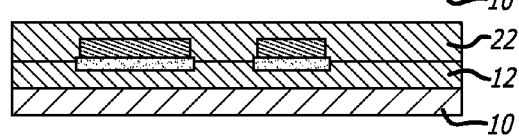
FIG. 1G  Pattern Resist & Etch Stainless Steel 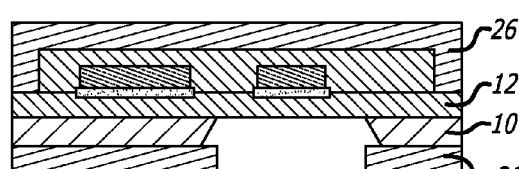
FIG. 1H  Pattern & Etch PI 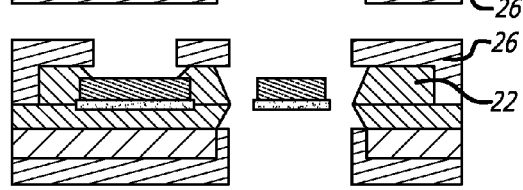
FIG. 1I  Resist Strip 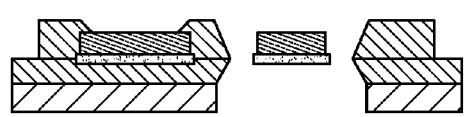
FIG. 1J  Ni/Au Plate 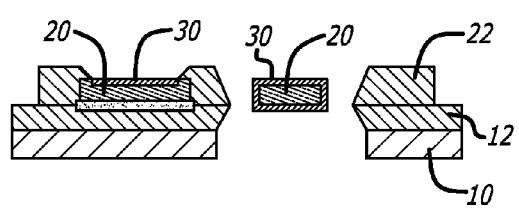

PSA vs. Time after bending

Softening resistance of lead frame materials
at an intermediate temperature level (350°C, or 660°F)

Stress-Strain Curves for Three Types of Copper

HIGH STRENGTH ELECTRODEPOSITED SUSPENSION CONDUCTORS

CROSS-REFERENCE TO RELATED APPLICATIONS

This application claims priority from U.S. provisional patent application No. 60/968,686 filed Aug. 29, 2007.

BACKGROUND OF THE INVENTION

1. Field of the Invention

This invention relates to the field of electrodeposited copper traces. More particularly, this invention relates to the field high strength electrodeposited copper signal traces for hard disk drive suspensions.

2. Description of Related Art

Typical magnetic hard disk drives for storing large amounts of data include a transducer mounted on a slider for reading and/or writing the data on the disk. In such systems, the slider is typically attached to an actuator arm by a suspension system, which includes both a load beam and a gimbal typically made of stainless steel. The flex trace suspension further includes the copper signal conductors which carry the data signals to/from the transducer, carried on a dielectric material such a polyimide which electrically isolates the signal traces from the stainless steel load beam. The copper signal conductors are defined upon the composite structure comprising the copper signal conductors, the insulating polyimide dielectric layer, and the stainless steel layer. The stainless steel layer provides both mechanical support and an electrical ground reference plane in this microstrip configuration.

Both additive and subtractive manufacturing processes may be used to build suspensions. Subtractive processes begin with preexisting laminates of stainless steel, dielectric, and copper. The laminates typical begin by depositing an alloy copper onto a drum. The resulting copper foil is then removed from the drum and laminated with a dielectric material and stainless steel underneath to form the composite structure which is then selectively patterned and etched to form the suspension including the signal conductors. Subtractive processes are well known in the art.

Early subtractive suspension manufacturing processes such as defined in U.S. Pat. No. 5,955,176 issued to Erpelding, et al. utilized rolled alloy copper foil C17510 which was laminated into a composite. Later, circuits transitioned to NK120 & C7025 alloys which possessed similar mechanical properties but exhibited approximately 20% improved conductivity and did not contain the hazardous substance beryllium. Alloy foils can also be strain- and precipitation-hardened to increase their mechanical properties.

To meet emerging density and signal propagation speeds, in more recent years manufacturers have increasingly relied on the additive method of manufacturing suspensions. This is because electrodeposited copper can generally be made thinner than the rolled copper of suspension laminates, thus producing very thin copper traces having the lower pitch and roll stiffness which is required for very small sliders.

Additive processes for making suspensions are well known in the art. In an additive process, various layers including dielectric and then copper are deposited on the stainless steel substrate serially. In a typical additive manufacturing process a polyimide dielectric layer is first cast onto the stainless steel and cured at high temperature. An adhesion layer is then sputtered onto the polyimide. The purpose of the adhesion layers is to enhance the bond between the polyimide dielectric and the copper signal traces. The adhesion layer may be, for example, Cr as disclosed in U.S. Pat. No. 4,863,808 to Sallo and U.S. Pat. No. 6,489,035 to Wang, or Ti or Monel as disclosed in U.S. Pat. No. 7,379,271 to Schreiber et al. Copper is then typically sputtered onto the adhesion layer, followed by electrodeposition of a copper layer to form the desired signal traces, a Ni layer for adhesion, and finally an additional polyimide layer for electrical insulation. Typically, the copper that is electrodeposited to form the signal traces is essentially pure copper and can be very thin, such as less than 10 µm. Other variations on, and refinements to, the basic additive process, including various cleaning and preparation steps, will not be discussed in detail herein because they are not considered relevant to the present discussion.

The suspension is an electromechanical system in which both the electrical and mechanical properties must be balanced. Mechanical properties are extremely important; the properties of spring rate, static attitude angle pitch, and roll stiffness must be stringently controlled to allow the read/write head to accurately fly over the recording media. Typical spring rates are in the range of 20 N/m, typical pitch and roll stiffness are in the range of 50 µNM/degree, and typical static attitude adjust angle tolerances for pitch (longitudinal axis) and roll (transverse axis) for today's head gimbals is 0.20 degrees. The copper trace should be thin for mechanical purposes (typically less than 10 µm) yet not prone to creep, and yet still carry electrical signals efficiently. The copper trace should preferably have a rectangular cross section rather than a trapezoidal cross section for increased routing density, and should have clean edge lines rather than be dendritic, and have smooth surfaces, for good electrical performance.

During manufacturing, fine adjustments are made to the pitch and roll static attitude of the gimbal and slider using mechanical and/or laser induced micro-bending. The main focus of the bending is usually to the outer arm portions of the suspension that are sometimes referred to as the out-rigger and in-rigger portions; however, the copper conductors of the suspension often experience enough stress during the static attitude adjustment so that they mechanically yield. If the copper yields, it will undergo stress relaxation (creep), and the precise suspension adjustment will creep or drift over time. Drift results in the air bearing slider performing poorly such as by flying higher than desired, which results in degraded reading and writing of the data to and from the disk.

SUMMARY OF THE INVENTION

The present invention provides a method of manufacturing an additive suspension circuit, and the resulting circuit, having a high copper conductor toughness that is resistant to stress relaxation (creep) and mechanical damage. Copper having a higher yield strength than pure electrodeposited copper is less susceptible to yielding and creep in the static attitude adjustment process.

Although pure electrodeposited copper provides superior conductor density over wrought (rolled) copper alloys typically used in subtractive circuitry, the mechanical properties of pure copper are generally inferior to those of the rolled copper alloys. The inadequate strength of the pure copper conductors is manifested in two principal traits. First, cantilevered or flying leads (partially or unsupported by dielectric) formed of pure copper are prone to mechanical damage. The mere momentum impact of a solder sphere bonding a slider can result in a static attitude shift. Second, static attitude adjustment instability attributable to Cu creep worsens over time. The high cure temperature of the polyimide resin typically used in a suspension exacerbates the problem by annealing the copper, which makes it more ductile, i.e., decreases its yield strength.

U.S. Pat. No. 5,454,926 issued to Clouser et al., for example, discloses a method of electrodepositing a high strength foil having a tensile strength of 413 MPa (60 Kpsi). However, the mechanical properties of the resulting copper foil are believed to degrade by more than 50% when subject to temperatures of 180° C., such as used to cure typical polyimide used as a suspension dielectric material.

It is possible to plate copper having improved mechanical properties by methods such as pulsed current regulation or limiting the amount of co-deposited organics used as grain refiners, surfactants and brighteners. However, the resulting copper is still prone to mechanical degradation in the high temperature cure processes required for the polyimide resins, e.g., 345° C. Modified epoxies and acrylics can be cured at lower temperatures; however, some of those materials lack the mechanical stability and low out-gas requirements mandated by hard disk drive micro-electronic assembly. Electrodepositing copper alloys allows pinning of the grains thereby limiting grain growth at high temperatures and maintaining the higher mechanical properties.

According to the present invention, an additive suspension copper alloy conductor may be formed utilizing electrodeposition methods which yield copper having superior mechanical properties both prior to and after exposure to high temperatures, e.g., around 180° C. In addition to copper ions and H+ ions which may be obtained from sulfuric acid, the plating solution contains tin ions which may be obtained from stannous sulfate, and iron ions which may be obtained from ferrous sulfate. The bath should contain a maximum of 0.1 mg/l of chloride ions. The plating should occur at a low current density, e.g., 10-45 amperes per square foot (ASF). The plating current is preferably pulsed in the kilohertz frequency range. Low temperatures overlay layers comprising epoxy or urethane, and having a low cure temperature, can be used to further minimize annealing.

The resulting electrodeposited copper alloys disclosed herein exhibit only about a 20% decrease in tensile strength after being subjected to the high temperatures used in curing the polyimide resin, compared to a decrease of greater than 50% characteristic of prior art additive suspension alloys.

According to the invention, the copper electrodeposition bath contains the following constituents in the following preferred amounts:

- Cu content obtained from copper sulfate, the copper sulfate concentration being in a concentration within the range of about 60-340 g/l, and more preferably within the range of about 60-248 g/l;
- Ferrous (Fe) content obtained from ferrous sulfate, the ferrous sulfate being in a concentration within the range of about 6-20 g/l, and more preferably within the range of about 6-8 g/l.
- Tin (Sn) content obtained from stannous sulfate, the stannous sulfate being in a concentration within the range of about 0.15-0.7 g/l, and more preferably within the range of about 0.2-0.5 g/l;
- Sulfuric acid in a concentration within the range of 11-17 g/l;
- Hydrochloric acid in a concentration within the range of about 50 ppm; and
- Chloride ions within the range of about 0-50 ppm.

Additionally, the electrodeposition bath should appropriate brighteners added. The electrodeposition preferably occurs at the following process parameters:

- Temperature from about 10-30° C., and more preferably from about 20-25° C.;
- Current density from about 10-45 amperes per square foot (ASF), and more preferably about 10-30 ASF, and more preferably still within the range of about 18-22 ASF, peak current at about 25% duty cycle pulsed at about 0-1.0 ms ON time, and more preferably about 0.4-0.6 ms ON time.

Exemplary embodiments of the invention will be further described below with reference to the drawings, in which like numbers refer to like parts.

BRIEF DESCRIPTION OF THE DRAWINGS

FIG. 1 illustrates an additive manufacturing process used to form a typical additive suspension;

DETAILED DESCRIPTION OF THE PREFERRED EMBODIMENTS

Figure 2:
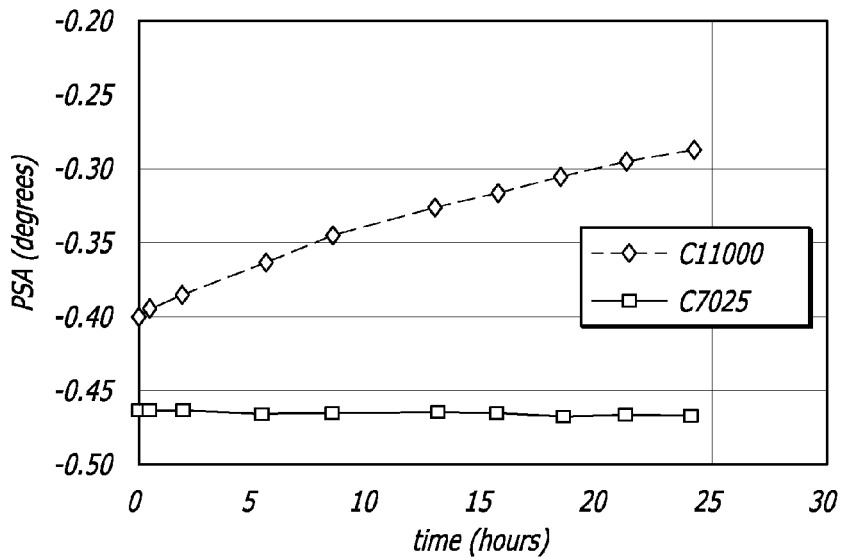
FIG. 2 is a graph which illustrates the difference between the yield strength of 99.9% pure electrodeposited copper (C 11000) after being formed into a complete suspension, and the yield strength of a typical wrought alloy copper (C7025) foil.

FIG. 1 illustrates an additive suspension manufacturing process used to form a typical additive suspension and its flex trace, and used to form a suspension according to the present invention. The steps are well known in the industry. In FIG. 1A, the suspension begins with a stainless steel sheet 10 which has been cleaned. In FIG. 1B, a coat of polyimide 12 is applied and cured. In FIG. 1C, an adhesion layer 14, such as sputtered Cr followed by sputtered Cu, is applied, then photoresist top and bottom layers 16 and 17, respectively, are applied, exposed, and developed to define a negative of the circuit pattern to be deposited.

In FIG. 1D, copper plating is performed to create copper signal trace conductors 20 which define the circuit pattern. In FIG. 1E, the photoresist layers 16 and 17 are stripped away. In FIG. 1F, a polyimide covercoating 22 is applied. In FIG. 1G, photoresist 26 is applied, patterned, exposed, and developed, and stainless steel 10 is etched away in the pattern desired. In FIG. 1H, photoresist 26 is additionally patterned, exposed, and developed, and the polyimide is etched to expose the portions of copper conductors 20 which will serve as contact pads. In FIG. 1I, photoresist 26 is stripped away. In FIG. 1J, the exposed portions of copper conductors 20 are plated with Ni/Au 30 for corrosion resistance and electrical bonding.

FIG. 2 is a graph which illustrates the difference between the change in position static attitude (PSA) of 99.9% pure electrodeposited copper (C11000) after being formed into a complete suspension, and the yield strength of a typical wrought alloy copper (C7025) foil. In the additive method of construction, the time and temperatures required to cure the polyimide resin fully annealed the electrodeposited copper, thus significantly reducing its mechanical strength. This reduced mechanical strength is manifested as a greater change in PSA over time for the pure electrodeposited copper.

Figure 3:
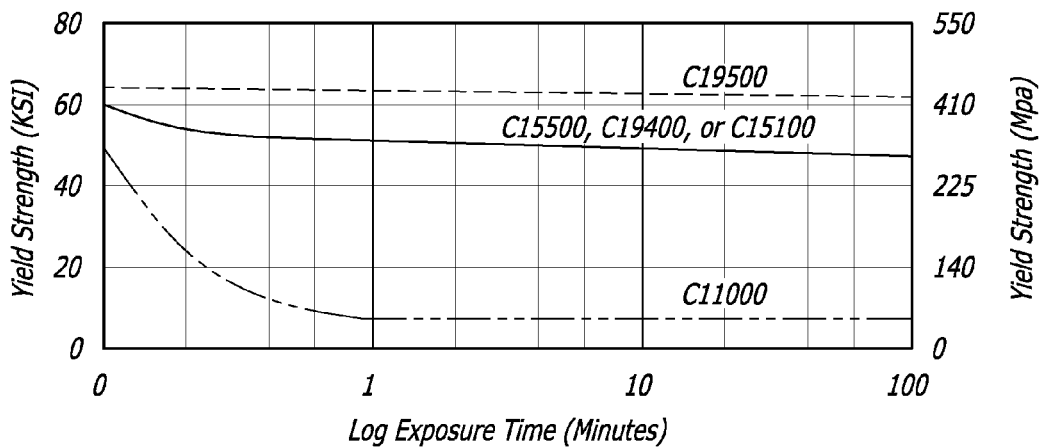
FIG. 3 is a graph of the yield strength over time for pure copper and for two copper alloys at a temperature of 350° C. (~660° F.)

FIG. 3 is a graph of the yield strength over time for pure copper (C11000) and for two copper alloys (C19500; and C1550, C19400, or C15100) at a temperature of 350° C. (~660° F.). The graph is taken from the ASTM Handbook, Desk Edition. Degradation in the mechanical properties of the copper will produce PSA creep over time on the assembled suspensions.

One aspect of the invention is to utilize deposition methods developed for foil manufacture to the selective deposition of copper to form the conductors. In one embodiment, the invention has been used in a web or roll-roll-format. In such a format, the suspension begins as a 20 µm thick stainless steel web which is then layered in an additive fashion. In particular, a polyimide layer 20 µm thick is cast on the stainless steel, followed by a layer of sputtered Cr for adhesion, followed by a sputtered Cu layer, followed by electrodeposited Cu alloy as the conductor layer with a photomask defining the desired circuit pattern, followed by a polyimide layer, followed by electrodeposited Ni/Au on exposed portions of the Cu alloy conductors that will form the electrical contacts.

The invention is applied at the copper electrodeposition step illustrated in FIG. 1 as the transition between FIGS. 1C and 1D. A low current density of approximately 15-45 amperes per square foot (ASF), which is equal to 1.5-4.4 amperes per square decimeter (ASD or $A/dm^2$), is used to electrodeposit the copper.

Additional, brighteners should preferably be added to the bath, as is well known in the industry. The term "brighteners" refers within the industry to additives added to the plating solution to enhance the resultant electrodeposited metal's appearance, uniformity, and grain structure. Modern commercially available brighteners include two separate components (A&B). The first component is a non ionic surfactant that aids in wetting the surface (reducing surface tension) and promoting uniform grain nucleation. The surfactant, unlike the other component, is not co-deposited or depleted and usually requires no or minimal subsequent additions. The second component is a leveler and grain refiner. Both of these components can be monitored and adjusted using cyclic voltammetric stripping (CVS) which is well known in the art. The commercial brightener PC-671 is one of the more common Cu sulfate commercial brighteners.

Example 1

In the preferred embodiment an electrolytic bath containing the following principal constituents is used, and electrodeposition took place under the following conditions:

| Common Name | Chemical Formula | Concentration |
| --- | --- | --- |
| Copper Sulfate (pentahydrous) | $CuSO_4 \cdot 5H_2O$ | 67 g/l |
| Copper Sulfate (anhydrous) | $CuSO_4$ | 225 g/l |
| Hydrochloric Acid | HCl | 0.154 m/l |
| PC-671 | | 3 ml/l |
| Stannous Sulfate (tin ions) | $SnSO_4$ | 4 g/l |
| Ferrous Sulfate (iron ions) | $FeSO_4$ | 40 g/l |

Current Density: 12 ASD (peak) (ON), 25% duty cycle, 500 Hz (0.5 ms ON, 1.5 ms OFF)

Acid copper plating is well known in the art, as exemplified by Metal Finishing, 55th Guidebook Directory (Metals and Plastics Publications Inc., Hackensack, N.J., 1987), pp. 212-215 which is hereby incorporated by reference in its entirety for its teachings of electrolytic copper plating baths and processes. The stannous sulfate, which can be difficult to get into solution, was mixed with a magnetic stirrer in a separate solution for seven days. The undissolved white stannous sulfate solid was filtered out of solution before electroplating.

Suspensions made according to this example exhibited an adjusted yield strength of 265 MPa, compared to 223 MPA for a suspension made from a commercially available rolled copper suspension alloy, and 127 MPa for a prior art suspension made by the assignee of the present invention according to a prior additive suspension manufacturing method. The phrase "adjusted yield strength" refers to the fact that the tested samples did not have the Cr layer removed and therefore the yield strength numbers produced were adjusted by 4% downward in order to estimate the yield strength of the Cu layer by itself. The commercially available rolled copper suspension alloy was circuit integrated suspension (CIS) copper foil, purchased from Nitto Denko Corporation of Osaka, Japan.

Figure 5:
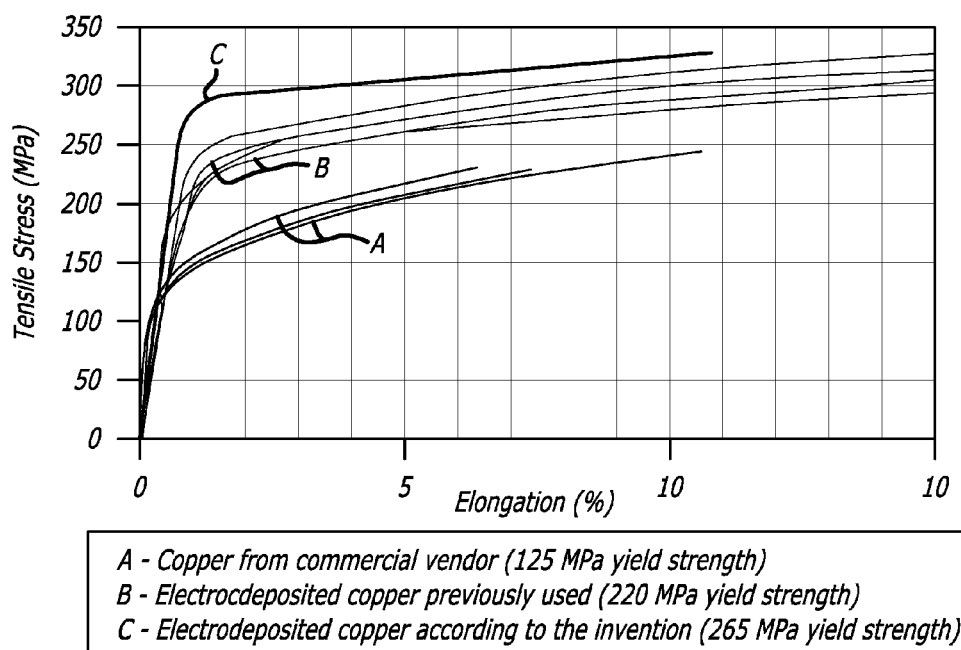
FIG. 5 is a plot of the stress vs. strain for copper electrodeposited produced according to the present, and for copper used in prior suspensions.

FIG. 5 is a plot of the stress vs. strain for copper electrodeposited according to this example, and for copper used in prior suspensions. As can be seen from the figure, copper alloy produced according to the present invention (trace C) withstood more stress before a given percentage of elongation than did the previously used production product (traces B), and significantly more stress than did the Nitto-Denko product (traces A).

Figure 6A:
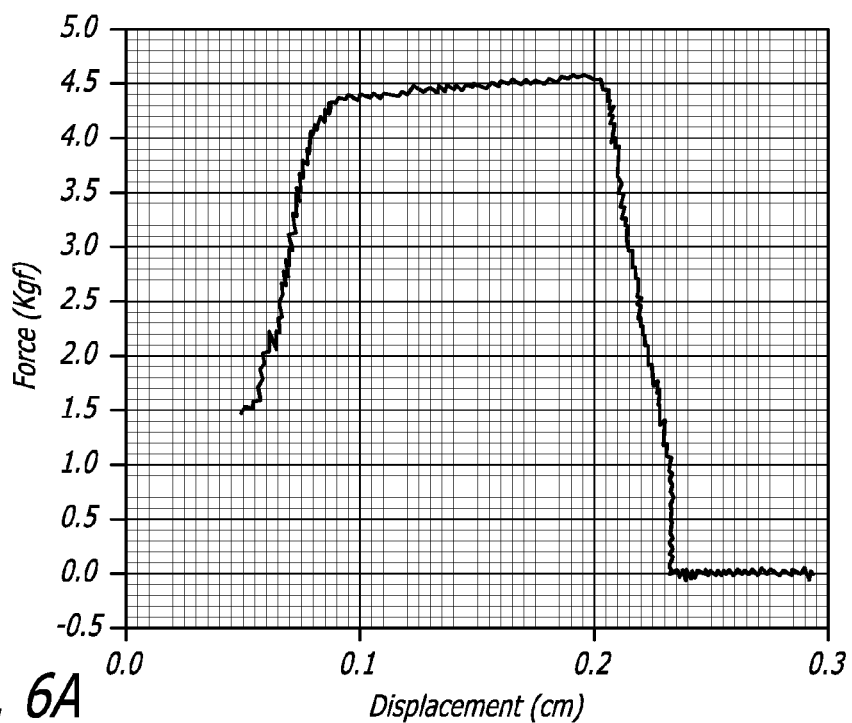
FIG. 6A is a plot of the stress vs. strain for copper electrodeposited according to an embodiment of the invention before baking the coverlay coating.
Figure 6B:
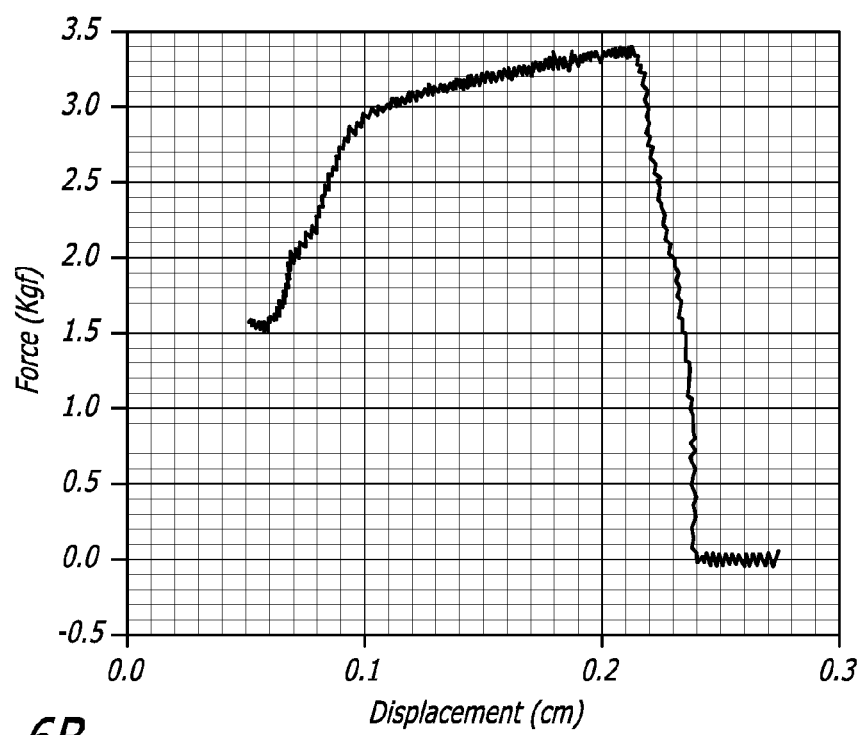
FIG. 6B is a plot of the stress vs. strain for copper electrodeposited according to an embodiment of the invention after baking the coverlay coating.

FIG. 6A is a plot of the stress vs. strain for copper electrodeposited according to this example before baking the coverlay coating. FIG. 6B is the same plot, but after baking The yield strength for the resulting deposit product of this example is listed in Table 1 below.

TABLE 1

| | Yield Strength of the Product of Example 1 | |
| --- | --- | --- |
| Condition | Yield Strength (Kips) | Yield Strength (MPA) |
| Pre-Bake | 47 | 323 |
| Post-Bake | 38 | 265 |

As can be seen from the data, the product of this example exhibited a loss in yield strength of only about 19%, which is significantly less than the loss in yield strength due to baking in prior additive suspension coppers. SEM micrographs not reproduced herein demonstrated that there was minimal grain growth (minimal annealing) from pre-bake to post-bake.

Example 2

Electrodeposited copper was prepared using the following electrolytic bath:

| Common Name | Chemical Formula | Concentration |
| --- | --- | --- |
| Copper Sulfate | $CuSO_4 \cdot 5H_2O$ | 283-334 g/l |
| Sulfuric Acid | $H_2SO_4$ | 110-200 g/l |
| Polyether | | 0.01-1.10 g/l |
| Stannous Sulfate (tin ions) | $SnSO_4$ | 0.5-1.0 g/l |

-continued

| Common Name | Chemical Formula | Concentration |
|---|---|---|
| Ferrous Sulfate (iron ions) | FeSO$_4$ | 0.5-5.0 g/l |
| Chloride ions | Cl$^-$ | ≦0.1 mg/l |

Temperature: 20-25° C.
Current Density: 15-45 ASF
Current Pulsing: 25-75%, 500 Hz This is the same bath chemical constituents as taught by Sakai et al. in U.S. Pat. No. 5,958,209 to plate a foil with high mechanical properties for etching that does not significantly degrade when subject to high temperature (180° C.). However, the bath was used at a different temperature and at a much lower current density than suggested by Sakai, and with current pulsing.

Unlike methods of manufacturing rolled copper foil in which the anode can be shaped to minimize the preferential plating to high current density areas (point source), and the edges of the electrodeposited foil can be trimmed, electrodepositing traces on a suspension involves complex circuit geometries having large ground areas that tend to plate significantly slower than isolated pads. Pulsed electrodeposition current was therefore employed to attain a more uniform deposit across the complex geometry of the suspension.

Example 3

A high throw copper plating solution with the following make up, operated at a bath temperature of approximately 20-25° C., will yield satisfactory results:

| Common Name | Chemical Formula | Concentration |
|---|---|---|
| Copper Sulfate | CuSO$_4$•5H$_2$O | 60-100 g/l |
| Sulfuric Acid | H$_2$SO$_4$ | 170-220 g/l |
| Stannous Sulfate (tin ions) | SnSO$_4$ | 0.5-1.0 g/l |
| Ferrous Sulfate (iron ions) | FeSO$_4$ | 0.5-5.0 g/l |
| Chloride ions | Cl$^-$ | <50 ppm |
| Brightener PC Gleam | | |

Temperature: 20-25° C.
Current Density: 15-45 ASF
Current Pulsing: 25-75%, 500 Hz The preferred 2-component commercially available brightener is Copper Gleam distributed by LeaRonel Inc. of Freeport, N.Y.

Example 4

An electrolytic bath containing the principal constituents listed in the table below was used. The resulting Fe and Sn contents of the resulting deposit product are also listed in the table.

| Common Name | Chemical Formula | Concentration (g/l) |
|---|---|---|
| Copper Sulfate (pentahydrate) | CuSO$_4$•5H$_2$O | 67 g/l |
| Sulfuric Acid | H$_2$SO$_4$ | 225 g/l |
| Hydrochloric acid | HCl | 0.084 ml |
| PC-671 | | 0.4 ml/l |
| Stannous Sulfate (tin ions) | SnSO$_4$ | 0.8 g/l |
| Ferrous Sulfate (iron ions) | FeSO$_4$•7H$_2$O | 2.5 g/l |
| Fe content in the solution by ICP | | 587 ppm (target 500) |
| Sn content in the solution by ICP | | 432 ppm (target 440) |

Figure 4:
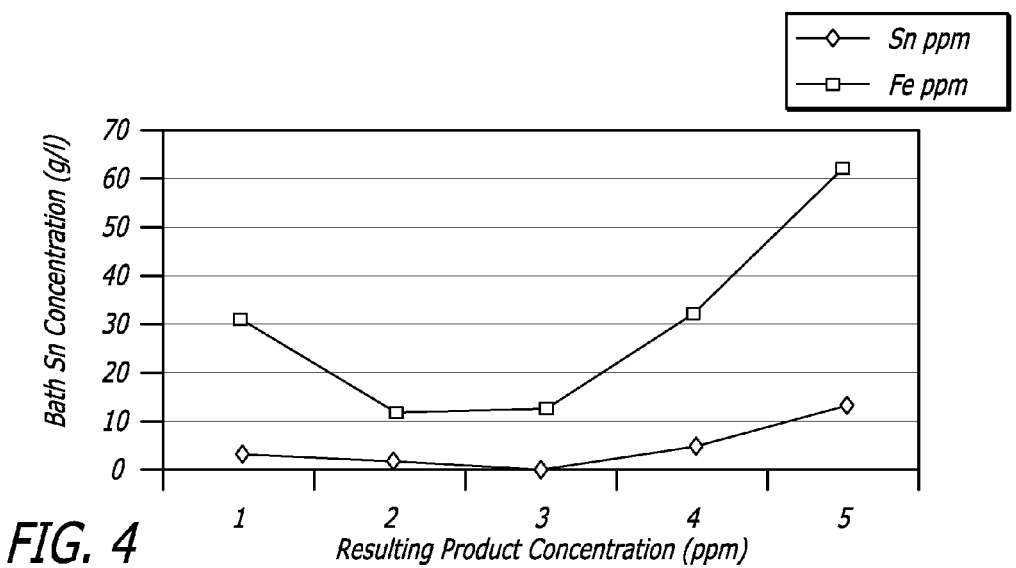
FIG. 4 is a graph of resulting Fe and Sn content in deposited copper as a function of Sn concentrate in the deposition bath.

Temperature: 20-25° C.
Current Density: 15-45 ASF
Current Pulsing: 25-75%, 500 Hz Additional solutions, assigned Example Nos. 4-11 below, were tested to determine the effects of bath constituent concentrations and current pulsing on the resulting Sn and Fe concentrations in the electrodeposited copper alloy. The target concentrations in the deposition were 0~50 ppm of Fe, and 50~1200 ppm of Sn. The results are presented in Table 2 below and in FIG. 4.

TABLE 2

Sn and Fe in Resulting Product for Various Bath Solutions and Current Parameters

| Sample information | Weight (g) | Result: Sn (ppm) | Result: Fe (ppm) |
|---|---|---|---|
| Cu standard | 0.1396 | 121 | 107 |
| Example 5: Cu PC-671 only | 0.0825 | <1 | 32 |
| Example 6: Cu—Sn 0.8 g/l | 0.1278 | 4 | 31 |
| Example 7: Cu—Sn 2 g/l | 0.0971 | 2 | 12 |
| Example 8: Cu—Sn 4 g/l | 0.1002 | 1 | 13 |
| Example 9: Cu—Sn 6 g/l | 0.1364 | 5 | 33 |
| Example 10: Cu—Sn 8 g/l | 0.1213 | 13 | 62 |
| Example 11: Cu—Sn 2 g/l Current Density: | 0.0853 | 187 | 20 |

DC-2ASD
Pulse: 2ASD 1 h

As can be seen in the data of Table 2, pulsing as in Example 10 greatly increases the Sn content of the deposit. In Example 10, the current used was a pulsed current (having an AC component) superimposed on a DC current. The current parameters (DC component, peak current density, duty cycle, and frequency) can be adjusted to achieve a target Sn content in the deposit of about 200-700 ppm, and more preferably about 350-550 ppm, and more preferably still about 440 ppm. Still further, the Fe content of the deposit can be increased by (a) greatly increasing the Fe content of the bath, (b) decreasing the acid content of the bath, or (c) doing both.

Figure 7:
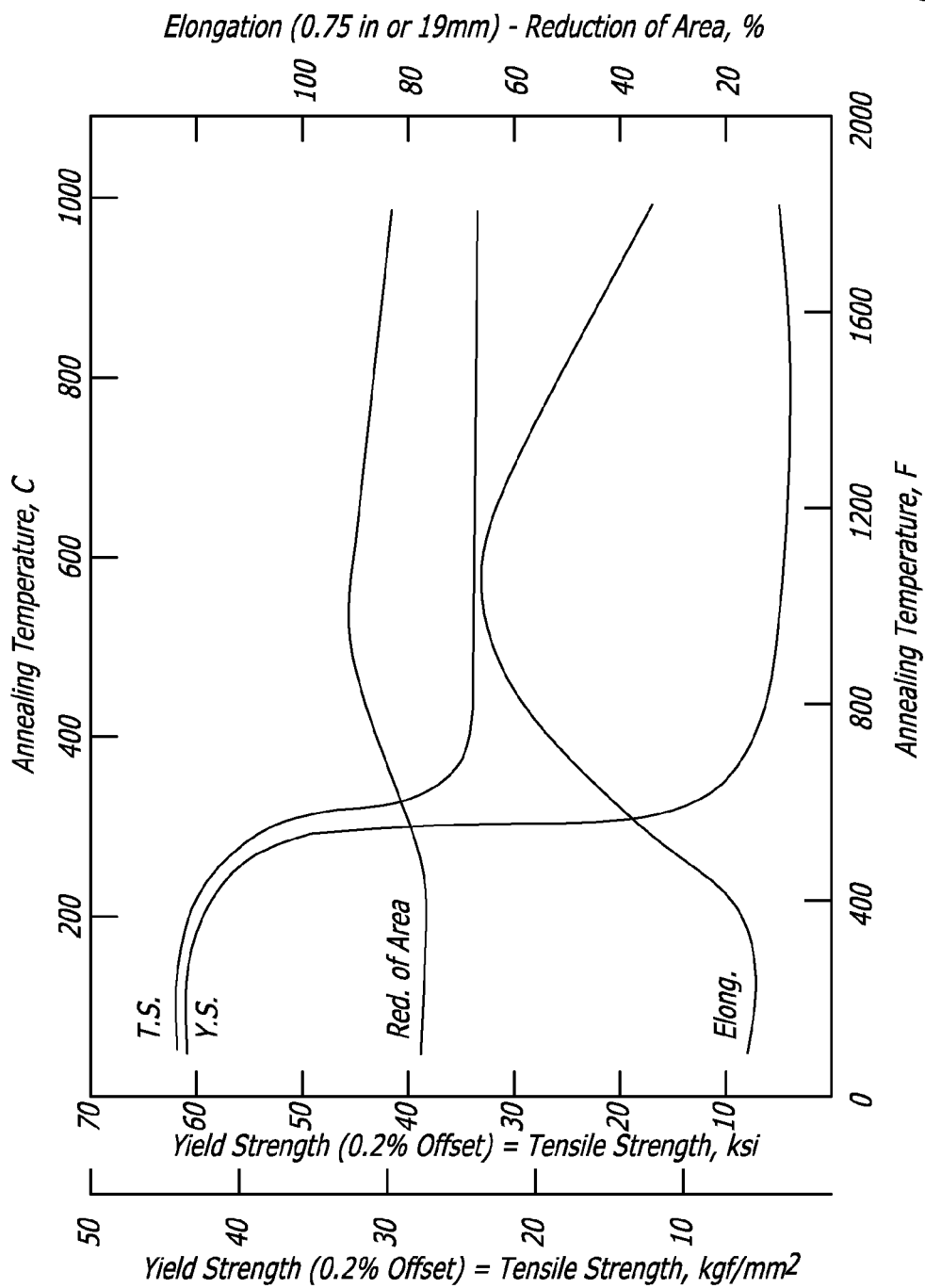
FIG. 7 is a graph of the effect of annealing temperature on the tensile properties of hard draw copper.

Additionally, in embodiments of the present invention, the protective and insulating overlay layer is made of a low cure temperature material such as epoxy or urethane, for which the curing process only requires temperatures having a maximum value from approximately 150° C. to approximately 190° C. By reducing the maximum overlay layer processing temperature below 200° C., the effects of annealing the copper are limited or eliminated. This allows the copper to maintain a greater proportion of its pre-bake yield strength, and thus improves the copper's creep resistance. FIG. 7 (taken from Crosby R. C., and Desy D. H., *Dispersion-Strengthening in Copper-Alumina and Copper-Yttria Alloys*, BM-RI-7266, Bureau of Mines, Washington, D.C., June 1969, which his incorporated by reference herein) shows a standard softening curve for pure copper and illustrates the fact that copper annealing starts to impact mechanical properties when the temperature at which the copper is processed reaches about 200° C. While it will be recognized that the graph of FIG. 7 does not apply exactly to the present invention due to the difference between pure copper and copper that is alloyed according to the invention, the graph may nevertheless illustrates annealing properties of copper and thus provides helpful information. In addition to having favorable curing temperatures, epoxy and urethane advantageously are readily available, are low in cost, and provide non-conductive circuit protection overlay layers.

It will be appreciated that the term "present invention" as used herein should not be construed to mean that only a single invention having a single essential element or group of elements is presented. Similarly, it will also be appreciated that the term "present invention" encompasses a number of separate innovations which can each be considered separate inventions. Although the present invention has thus been described in detail with regard to the preferred embodiments and drawings thereof, it should be apparent to those skilled in the art that various adaptations and modifications of the present invention may be accomplished without departing from the spirit and the scope of the invention. Accordingly, it is to be understood that the detailed description and the accompanying drawings as set forth hereinabove are not intended to limit the breadth of the present invention, which should be inferred only from the following claims and their appropriately construed legal equivalents.

We claim:

1. A method of manufacturing a flying lead in an additive hard disk drive suspension circuit, the method comprising:
   applying a dielectric onto a sheet of stainless steel;
   sputtering onto the dielectric at least one metal selected from the group consisting of nickel and chromium;
   electrodepositing in a predetermined pattern signal traces, the signal traces having a copper alloy comprising tin, iron, and copper over the sputtered metal, the alloy being electrodeposited from an electrolytic bath comprising:
      copper sulfate in a concentration within a range of about 60-340 g/l;
      ferrous sulfate in a concentration within the range of about 6-20 g/l;
      stannous sulfate in a concentration within the range of about 0.15-0.7 g/l; and
      chloride ions of less than 0.1 mg/l;
   wherein the electrodeposition proceeds:
      using a pulsed current having a peak amplitude within the range of 18-22 amperes per square foot;
      in an electrodeposition bath having a temperature within the range of 20-25° C.; and
      with a current that is selected to achieve a tin content of the alloy within the range of 200-700 ppm;
   applying an insulator over the signal traces;
   baking the insulator at a temperature of less than 200°;
   etching away sufficient stainless steel, dielectric, and insulator so as to leave at least portions of the signal traces unsupported thereby, the unsupported portions of the signal traces defining flying leads;
   electrodepositing nickel onto the flying leads; and
   electrodepositing gold onto the nickel;
   whereby a suspension circuit having a flying lead is produced.

2. The method of claim 1 wherein the pulsed current has a duty cycle of about 25%.

3. The method of claim 1 wherein the electrodeposition is carried out using a pulsed current having current parameters being selected so as to produce a tin content of the alloy within a range of about 350-550 ppm.

4. The method of claim 1 wherein the pulsing parameters are selected so as to produce a tin content of the alloy of about 440 ppm.

5. The method of claim 1 wherein the pulsed current has an ON time of from about 0-1.0 ms.

6. The method of claim 1 wherein the pulsed current has a duty cycle within a range of about 25%-75%.

7. The method of claim 1 wherein the electrodeposition current has an AC component superimposed on a DC current.

8. The circuit produced according to the method of claim 1.

9. A method of manufacturing an additive hard disk drive suspension circuit having a flying lead, the method comprising:
   providing a sheet of stainless steel;
   applying a dielectric onto the stainless steel and curing the dielectric;
   applying at least one metallic adhesion layer to the dielectric; and
   electrodepositing in a predetermined pattern signal traces comprising tin, iron, and copper onto the adhesion layer, the alloy being electrodeposited from an electrolytic bath comprising:
      copper sulfate in a concentration within a range of about 60-340 g/l;
      ferrous sulfate in a concentration within the range of about 6-20 g/l; and
      stannous sulfate in a concentration within the range of about 0.15-0.7 g/l;
   wherein the electrodeposition proceeds using a pulsed current having a peak amplitude of less than about 45 amperes per square foot, and the electrodeposition bath has a temperature of less than about 30° C., the method further comprising:
   applying an insulator over the signal traces;
   baking the insulator at a temperature of less than 200° C.;
   etching away sufficient stainless steel, dielectric, and insulator so as to leave at least portions of the signal traces unsupported thereby, the unsupported portions of the signal traces defining flying leads;
   electrodepositing nickel onto the flying leads; and
   electrodepositing gold onto the nickel;
   whereby a suspension circuit having a flying lead is produed.

10. The method of claim 9 wherein the peak current density is within a range of about 18-22 amperes per square foot.

11. The method of claim 9 wherein the ferrous sulfate concentration is within the range of about 6-8 g/l.

12. The method of claim 9 wherein the stannous sulfate concentration is within the range of about 0.2-0-0.5 g/l.

13. The method of claim 9 wherein the electrodeposition is carried out using a pulsed current having current parameters being selected so as to produce a tin content of the alloy within a range of about 350-550 ppm.

14. The method of claim 9 wherein the step of baking the insulator proceeds within the range of approximately 150-190° C.

15. The method of claim 9 wherein the insulator has a curing temperature within the range of approximately 150-190° C.

16. The method of claim 14 wherein the electrodeposition is carried out using a pulsed current having current parameters being selected so as to produce a tin content of the alloy within a range of about 350-550 ppm.

* * * * *

UNITED STATES PATENT AND TRADEMARK OFFICE
CERTIFICATE OF CORRECTION

PATENT NO.        : 8,303,792 B1  
APPLICATION NO.   : 12/200947  
DATED             : November 6, 2012  
INVENTOR(S)       : Christopher Schreiber, Peter Hahn and Christopher Dunn Page 1 of 1

It is certified that error appears in the above-identified patent and that said Letters Patent is hereby corrected as shown below:

In claim 1, column 9, line 51, after "200°" insert -- C --.

In claim 12, column 10, line 49, after "about 0.2" delete "-0".

Signed and Sealed this  
First Day of January, 2013

David J. Kappos  
*Director of the United States Patent and Trademark Office*